US012666925B2

(12) United States Patent
Chen

(10) Patent No.: US 12,666,925 B2
(45) **Date of Patent: \*Jun. 23, 2026**

(54) JIGS AND METHODS OF TEACHING SUBSTRATE HANDLING IN SEMICONDUCTOR PROCESSING SYSTEMS USING JIGS

(71) Applicant: ASM IP Holding, B.V., Almere (NL)

(72) Inventor: Dongyang Chen, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 773 days.

This patent is subject to a terminal disclaimer.

(21) Appl. No.: 17/934,878

(22) Filed: Sep. 23, 2022

(65) Prior Publication Data

US 2023/0100356 A1    Mar. 30, 2023

Related U.S. Application Data

(60) Provisional application No. 63/248,766, filed on Sep. 27, 2021.

(51) Int. Cl.
H10P 72/76 (2026.01)
H10P 72/00 (2026.01)

(52) U.S. Cl.
CPC ...... H10P 72/7612 (2026.01); H10P 72/0606 (2026.01)

(58) Field of Classification Search
CPC .......... H01L 21/68742; H01L 21/67259; H01J 2237/332–3348
USPC ........................................................ 118/728
See application file for complete search history.

(56) References Cited

U.S. PATENT DOCUMENTS

| | | | | |
|---|---|---|---|---|
| RE29,582 | E | 3/1978 | Brown | |
| 5,323,382 | A | 6/1994 | Takahashi | |
| 6,363,623 | B1 * | 4/2002 | Abraham | H01L 21/68792 |
| | | | | 34/317 |
| 10,968,744 | B2 | 4/2021 | Snyder | |
| 10,976,119 | B2 | 4/2021 | Veto | |
| 11,353,381 | B1 | 6/2022 | Holeyannavar | |
| 2003/0139852 | A1 * | 7/2003 | Kataoka | H01L 21/6875 |
| | | | | 700/258 |
| 2005/0034288 | A1 * | 2/2005 | Adachi | H01L 21/67259 |
| | | | | 29/25.01 |
| 2005/0233770 | A1 * | 10/2005 | Ramsey | H05K 1/184 |
| | | | | 455/561 |

(Continued)

*Primary Examiner* — Charlee J. C. Bennett
(74) *Attorney, Agent, or Firm* — Banner & Witcoff, Ltd.

(57) ABSTRACT

A jig for teaching substrate handling in a semiconductor processing system includes a verification pin with a pin width and a disc body. The disc body has a first surface, a second surface opposite the first surface, and a thickness separating the second surface from the first surface of the disc body. The first and second surfaces define a verification aperture coupling the first surface to the second surface of the disc body. The verification aperture has an aperture width equivalent to the pin width of the verification pin to teach a transfer position by slidably receiving the verification pin in the verification aperture and a verification pin seat defined in a load lock of the semiconductor processing system while supported by a substrate transfer robot within the semiconductor processing system. Semiconductor processing systems and methods of teaching substrate handling in semiconductor processing systems are also described.

15 Claims, 10 Drawing Sheets

(56)  References Cited

U.S. PATENT DOCUMENTS

| | | | |
|---|---|---|---|
| 2010/0033706 A1* | 2/2010 | Shindo | H01L 21/67259 |
| | | | 355/74 |
| 2011/0015774 A1* | 1/2011 | Owaki | H01L 21/67276 |
| | | | 700/110 |
| 2020/0393242 A1* | 12/2020 | Vishwanath | H01J 37/32807 |
| 2022/0076986 A1 | 3/2022 | Chen | |
| 2023/0105844 A1* | 4/2023 | Chen | B25J 9/1656 |
| | | | 700/121 |

* cited by examiner

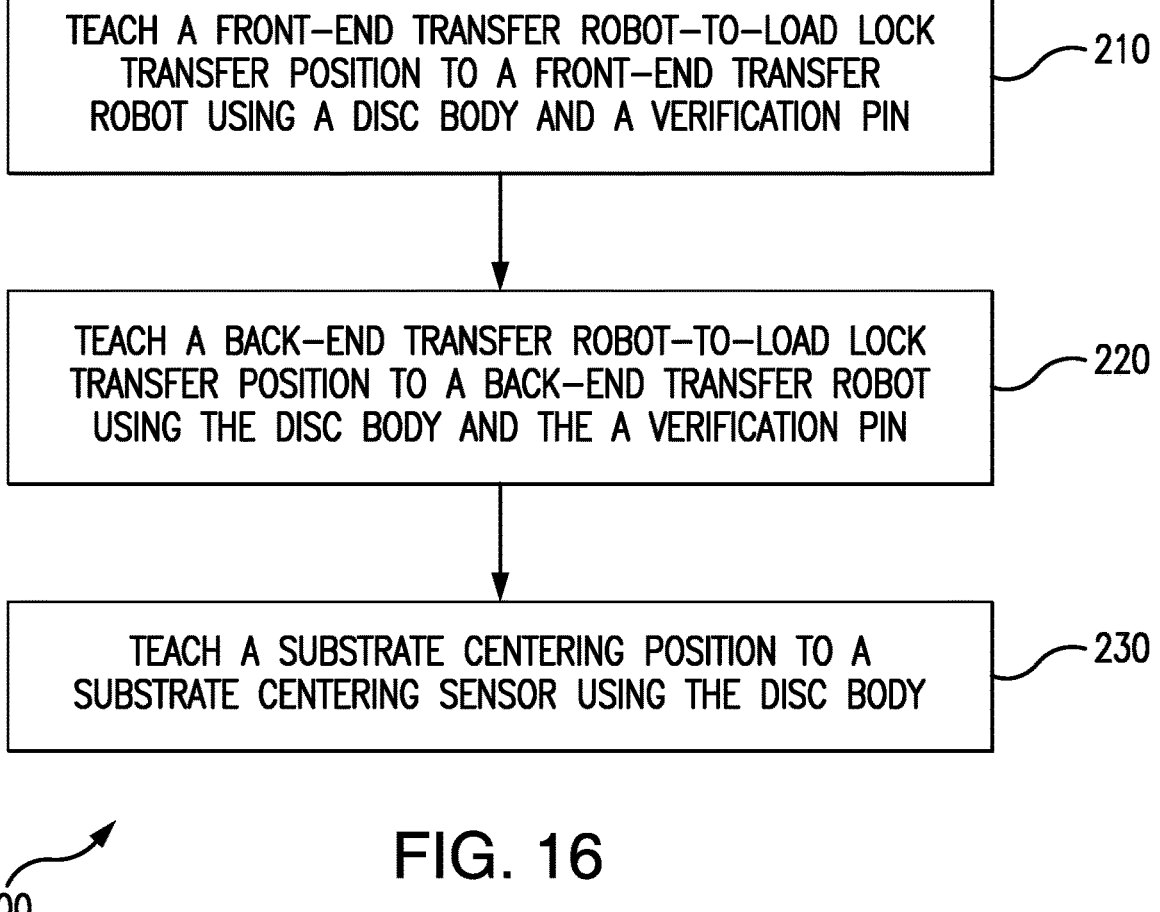

TEACH A FRONT-END TRANSFER ROBOT-TO-LOAD LOCK TRANSFER POSITION TO A FRONT-END TRANSFER ROBOT USING A DISC BODY AND A VERIFICATION PIN ⟋210

TEACH A BACK-END TRANSFER ROBOT-TO-LOAD LOCK TRANSFER POSITION TO A BACK-END TRANSFER ROBOT USING THE DISC BODY AND THE A VERIFICATION PIN ⟋220

TEACH A SUBSTRATE CENTERING POSITION TO A SUBSTRATE CENTERING SENSOR USING THE DISC BODY ⟋230

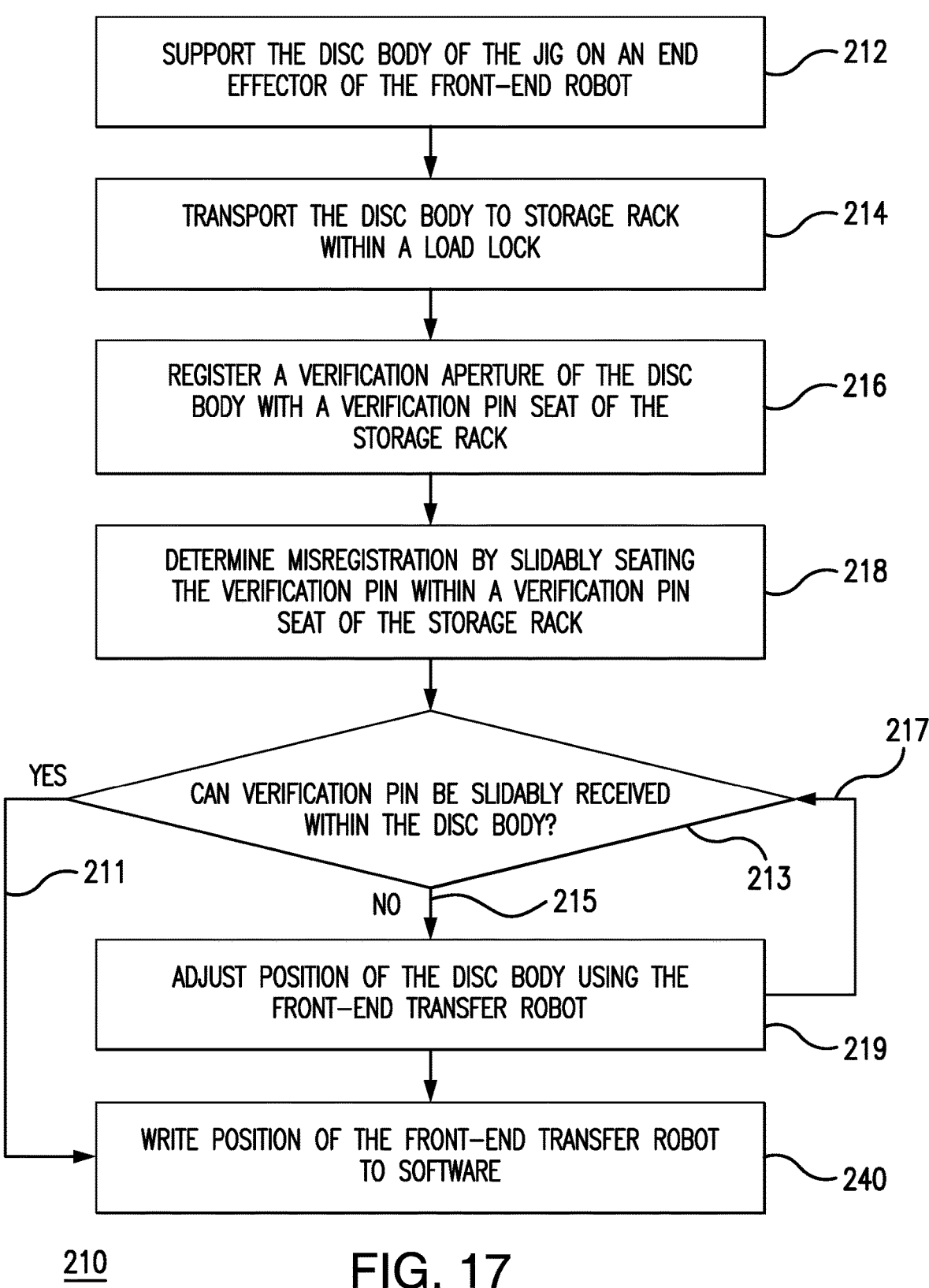

SUPPORT THE DISC BODY OF THE JIG ON AN END EFFECTOR OF THE FRONT-END ROBOT ⌇212

TRANSPORT THE DISC BODY TO STORAGE RACK WITHIN A LOAD LOCK ⌇214

REGISTER A VERIFICATION APERTURE OF THE DISC BODY WITH A VERIFICATION PIN SEAT OF THE STORAGE RACK ⌇216

DETERMINE MISREGISTRATION BY SLIDABLY SEATING THE VERIFICATION PIN WITHIN A VERIFICATION PIN SEAT OF THE STORAGE RACK ⌇218

217

YES          CAN VERIFICATION PIN BE SLIDABLY RECEIVED WITHIN THE DISC BODY?

211          NO        215        213

ADJUST POSITION OF THE DISC BODY USING THE FRONT-END TRANSFER ROBOT ⌇219

WRITE POSITION OF THE FRONT-END TRANSFER ROBOT TO SOFTWARE ⌇240

210                    FIG. 17

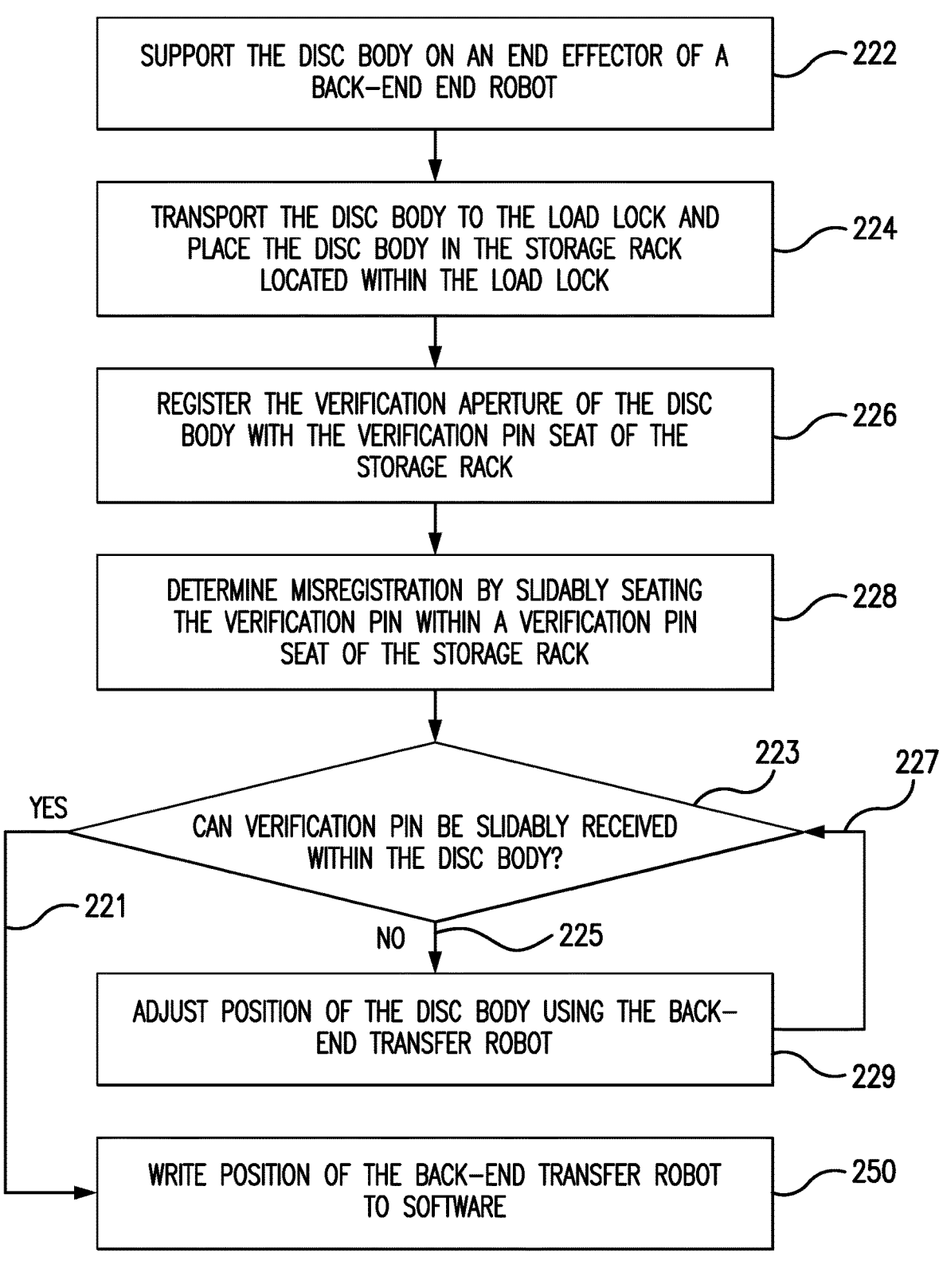
220          FIG. 18

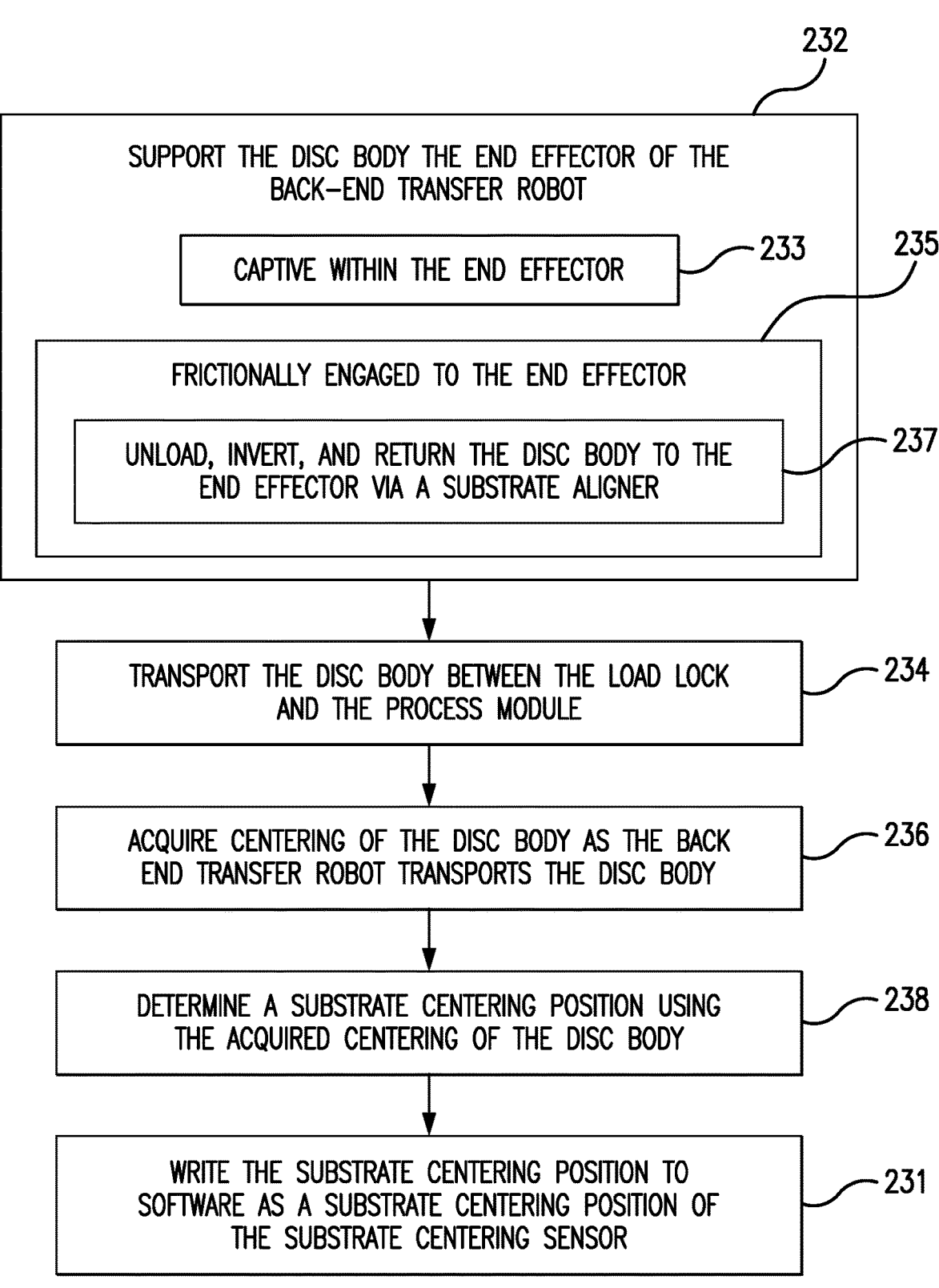

SUPPORT THE DISC BODY THE END EFFECTOR OF THE
BACK—END TRANSFER ROBOT

CAPTIVE WITHIN THE END EFFECTOR

FRICTIONALLY ENGAGED TO THE END EFFECTOR

UNLOAD, INVERT, AND RETURN THE DISC BODY TO THE
END EFFECTOR VIA A SUBSTRATE ALIGNER

TRANSPORT THE DISC BODY BETWEEN THE LOAD LOCK
AND THE PROCESS MODULE

ACQUIRE CENTERING OF THE DISC BODY AS THE BACK
END TRANSFER ROBOT TRANSPORTS THE DISC BODY

DETERMINE A SUBSTRATE CENTERING POSITION USING
THE ACQUIRED CENTERING OF THE DISC BODY

WRITE THE SUBSTRATE CENTERING POSITION TO
SOFTWARE AS A SUBSTRATE CENTERING POSITION OF
THE SUBSTRATE CENTERING SENSOR

230                    FIG. 19

JIGS AND METHODS OF TEACHING SUBSTRATE HANDLING IN SEMICONDUCTOR PROCESSING SYSTEMS USING JIGS

FIELD OF INVENTION

The present disclosure generally relates to fabricating semiconductor devices, and more particularly, to substrate handling in semiconductor processing systems used to fabricate semiconductor devices.

BACKGROUND OF THE DISCLOSURE

Process tools employed to fabricate semiconductor devices commonly include reaction chambers to carry out any number of processes, such as degassing, cleaning or pre-cleaning, deposition such as chemical vapor deposition (CVD), physical vapor deposition (PVD), or atomic layer deposition (ALD), coating, oxidation, nitration, etching (e.g., plasma etch), or the like. A load lock chamber may be provided to enable entry and exit of substrates from a factory interface. The reaction chamber and load lock chamber may be included in a cluster tool, and two or more reaction chambers may be distributed about a transfer chamber, for example. A front-end transfer robot may be housed within the factory interface to transport substrates (e.g., silicon wafers, glass plates, or the like) between the factory interface and the load lock, and a back-end transfer robot may be housed within the transfer chamber to transport the substrate between the load lock and one or more of the reaction chamber. Transport of the substrates to and from the reaction may be accomplished by one or more end effectors (e.g., clamps or blades) carried by the front-end transfer robot and the back-end transfer robot, and positioning of substrates within the reaction chamber may be according to a centering sensor arranged within the transfer chamber.

During processing, the front-end transfer robot retrieves substrates from a pod and transports the substrates through the front-end module to the load lock chamber. From the load lock chamber, the substrates are transported by the back-end transfer robot to the reaction chamber, wherein the substrates are processed according to the requirements of the semiconductor devices being fabricated. Once processed, the back-end transfer robot transports the substrate back to the load lock chamber, the front-end transfer robot transports the substrate from the load lock chamber back to the pod, and the pod is thereafter removed from the process tool. Typically, transport of the substrate within the process tool is according to positions taught to one or more of the front-end transfer robot, the back-end transfer robot, and a centering sensor—generally during process tool qualification and/or during maintenance events.

In some process tools, the front-end transfer robot-to-load lock transfer position may be taught using imagery acquired from a camera substrate, the back-end transfer robot-to load lock transfer position may be taught by matching position of a dummy silicon substrate to scribing within the process tool, and the substrate centering position may be taught by cycling dummy silicon substrates past the centering sensor. While generally acceptable for its intended purpose, camera substrates are expensive and typically require periodic calibration to ensure accuracy, accuracy of positions established by matching dummy silicon substrates to scribing may be limited by the skill of the individual observing the matchup, and slippage or shifting of dummy silicon substrates on the end effector transporting the dummy substrate may limit accuracy of centering positions taught to centering sensors. Availability of camera substrates and/or the need to repeat position teaching may therefore prolong qualification and limit availability of the process tool.

Such methods and systems have generally been considered suitable for their intended purpose. However, there remains a need in the art for improved jigs, semiconductor processing systems, and methods of teaching substrate handling in semiconductor processing systems. The present disclosure provides a solution to one or more of these needs.

SUMMARY OF THE DISCLOSURE

A jig for teaching substrate handling in a semiconductor processing system includes a verification pin with a pin width and a disc body. The disc body has a first surface, a second surface opposite the first surface, and a thickness separating the second surface from the first surface of the disc body. The first surface and the second surface define a verification aperture that couplies the first surface of the disc body to the second surface of the disc body. The verification aperture has an aperture width that is substantially equivalent to the pin width of the verification pin to teach a transfer position by slidably receiving the verification pin in the verification aperture and a verification pin seat defined in a load lock of the semiconductor processing system while the disc body is supported by a substrate transfer robot within the semiconductor processing system.

In addition to one or more of the features described above, or as an alternative, further examples of the jig may include that the disc body is formed from a carbon fiber material.

In addition to one or more of the features described above, or as an alternative, further examples of the jig may include that the disc body has a diameter that is substantially equivalent to a diameter of a 300-millimeter silicon wafer.

In addition to one or more of the features described above, or as an alternative, further examples of the jig may include that the disc body has one or more lightening aperture. The one or more lightening aperture may extend through the thickness of the disc body. The one or more lightening aperture may couple the first surface of the disc body to the second surface of the disc body. The one or more lightening aperture may be located radially between the verification aperture and the outer circumference of the disc body. The verification aperture may be centrally located on the first surface and the second surface of the disc body, and the one or more lightening aperture may be radially offset from the verification aperture. For example, the verification aperture may proximate the verification aperture, i.e., closer to the verification aperture than the outer circumference of the disc body.

In addition to one or more of the features described above, or as an alternative, further examples of the jig may include that the lightening aperture is one of two or more of lightening apertures symmetrically distributed about the verification aperture.

In addition to one or more of the features described above, or as an alternative, further examples of the jig may include that the lightening aperture is one of four (4) lightening apertures. The lightening apertures may have a circular shape. The four (4) lightening apertures may be distributed circumferentially about the verification aperture on a common lightening aperture radius, e.g., on a circumference concentric with the verification aperture.

In addition to one or more of the features described above, or as an alternative, further examples of the jig may include one or more friction member. The one or more friction member may be fixed to the first surface of the disc body. The one or more friction member may be located radially between the verification aperture and the outer circumference of the disc body.

In addition to one or more of the features described above, or as an alternative, further examples of the jig may include that the friction member has a coefficient of friction. The coefficient of friction of the friction member may be greater than a coefficient of friction of a surface of a surface of a dummy silicon wafer.

In addition to one or more of the features described above, or as an alternative, further examples of the jig may include that the friction member includes an O-ring. The O-ring may be formed from an elastomeric material.

In addition to one or more of the features described above, or as an alternative, further examples of the jig may include that the friction member is one of a two or more friction members fixed to the first surface of the disc body. The two or more friction members may be asymmetrically distributed about the verification aperture.

In addition to one or more of the features described above, or as an alternative, further examples of the jig may include that the friction member is one of three (3) friction members fixed to the first surface of the disc body. The three (3) friction members may be distributed circumferentially about the verification aperture. The three (3) or more friction members may be arranged on a common friction member radius.

In addition to one or more of the features described above, or as an alternative, further examples of the jig may include that arrangement of the two or more friction members of the first surface of the disc body conforms to a footprint of an effector carried by a substrate transfer robot within the semiconductor processing system.

In addition to one or more of the features described above, or as an alternative, further examples of the jig may include that the disc body has an annular rim extending circumferentially about the verification aperture. The annular rim may be located radially between the verification aperture and the outer circumference of the disc body.

In addition to one or more of the features described above, or as an alternative, further examples of the jig may include that the annular rim extends between a radially outer thin portion of the disc body and a radially inner thick portion of the disc body. The radially inner thick portion of the disc body may extend radially between the annular rim and the verification aperture extending through the thickness of the disc body.

In addition to one or more of the features described above, or as an alternative, further examples of the jig may include that one or more friction member may be fixed to the first surface of the disc body and positioned radially between the annular rim and the outer circumference of the disc body.

In addition to one or more of the features described above, or as an alternative, further examples of the jig may include that the annular rim is defined on one of the first surface and the second surface of the disc body, and that the at least one friction member is fixed to the other of the first surface and the second surface of the disc body.

In addition to one or more of the features described above, or as an alternative, further examples of the jig may include that the disc body has one or more lightening aperture extending through the thickness of the disc body, and that the one or more one lightening aperture is located radially between the verification aperture and the annular rim of the disc body.

In addition to one or more of the features described above, or as an alternative, further examples of the jig may include that the annular rim conforms in radius to a face of an arcuate segment of the end effector.

In addition to one or more of the features described above, or as an alternative, further examples of the jig may include that the outer circumference of the disc body has a notch. The notch may conform to a notch defined within a 300-millimeter silicon wafer.

A semiconductor processing system is provided. The semiconductor processing system includes a load lock with a verification pin seat, a substrate centering sensor with a field of view fixed relative to the load lock, a front-end substrate transfer robot with a clamp-type end effector supported for movement relative for movement relative to the load lock, a back-end substrate transfer robot with a blade-type end effector supported for movement relative to the load lock, and a jig as described above. The disc body is (a) clamped within the clamp-type end effector and fixed to the load lock by the verification pin, (b) frictionally supported on the blade-type end effector and fixed to the load lock by the verification pin, (c) captively supported on the blade-type end effector and fixed to the load lock by the verification pin, or (d) frictionally supported or captively supported on the blade-type end effector and within the field of view of the substrate centering sensor.

In addition to one or more of the features described above, or as an alternative, further examples of the semiconductor processing system may include that the disc body is clamped within the clamp-type end effector of the front-end transfer robot, and that the verification pin is slidably received within the verification pin seat of the load lock and the verification aperture of the disc body.

In addition to one or more of the features described above, or as an alternative, further examples of the semiconductor processing system may include that the disc body is supported on the blade-type end effector of the back-end transfer robot, and that the verification pin is slidably received within the verification pin seat of the load lock and the verification aperture of the disc body.

In addition to one or more of the features described above, or as an alternative, further examples of the semiconductor processing system may include that the disc body is supported on the blade-type end effector of the back-end transfer robot, and that the disc body is disposed within the field of view of the substrate centering sensor.

In addition to one or more of the features described above, or as an alternative, further examples of the semiconductor processing system may include that the disc body is captive between blades of the blade-type end effector of the back-end transfer robot.

In addition to one or more of the features described above, or as an alternative, further examples of the semiconductor processing system may include that the disc body is spaced apart from blades of the blade-type end effector of the back-end transfer robot.

A method of teaching substrate handling in a semiconductor processing system is provided. The method includes, with a jig as described above, teaching a front-end transfer robot-to-load lock transfer position to a front-end transfer robot of the semiconductor processing system using the disc body and the verification pin, teaching a back-end transfer robot-to-load lock transfer position to a back-end transfer robot of the semiconductor processing system using the disc body and the verification pin, and teaching a substrate centering position to a substrate centering sensor of the semiconductor processing system using the disc body of the jig. Either (or both) the front-end transfer robot-to-load lock transfer position and the back-end transfer robot-to-load lock transfer position is taught by slidably receiving the verification pin in both the verification aperture and a verification pin seat defined in a load lock of the semiconductor processing system while the disc body is supported by a substrate transfer robot within the semiconductor processing system.

In addition to one or more of the features described above, or as an alternative, further examples of the method may include that that teaching the front-end transfer robot-to-load lock transfer position includes supporting the disc body on an end effector of a front-end transfer robot, determining misregistration between the verification aperture and a verification pin seat of the semiconductor processing system, adjusting position of the disc body when the misregistration prevents slidably receiving the verification pin into the verification aperture disc body, and writing position of the front-end transfer robot as the front-end transfer robot-to-load lock transfer position when the misregistration allows the verification pin to be slidably received within the verification aperture.

In addition to one or more of the features described above, or as an alternative, further examples of the method may include that teaching the back-end transfer robot-to-load lock transfer position includes supporting the disc body on an end effector of a back-end transfer robot, determining misregistration between the verification aperture and a verification pin seat of the semiconductor processing system, adjusting position of the disc body when the misregistration prevents slidably receiving the verification pin into the verification aperture disc body, and writing position of the back-end transfer robot as the back-end transfer robot-to-load lock transfer position when the misregistration allows the verification pin to be slidably received within the verification aperture.

In addition to one or more of the features described above, or as an alternative, further examples of the method may include supporting the disc body on a blade-type end effector of the back-end substrate transfer robot such that the disc body is captive on the blade-type end effector.

In addition to one or more of the features described above, or as an alternative, further examples of the method may include supporting the disc body on a blade-type end effector of the back-end substrate transfer robot such that the disc body is spaced apart from the blade-type end effector.

In addition to one or more of the features described above, or as an alternative, further examples of the method may include unloading the disc body from the semiconductor processing system, inverting the disc body, and reloading the disc body onto the semiconductor processing system prior to teaching the substrate centering position.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain examples of the present disclosure, which are intended to illustrate and not to limit the invention.

Figure 1:
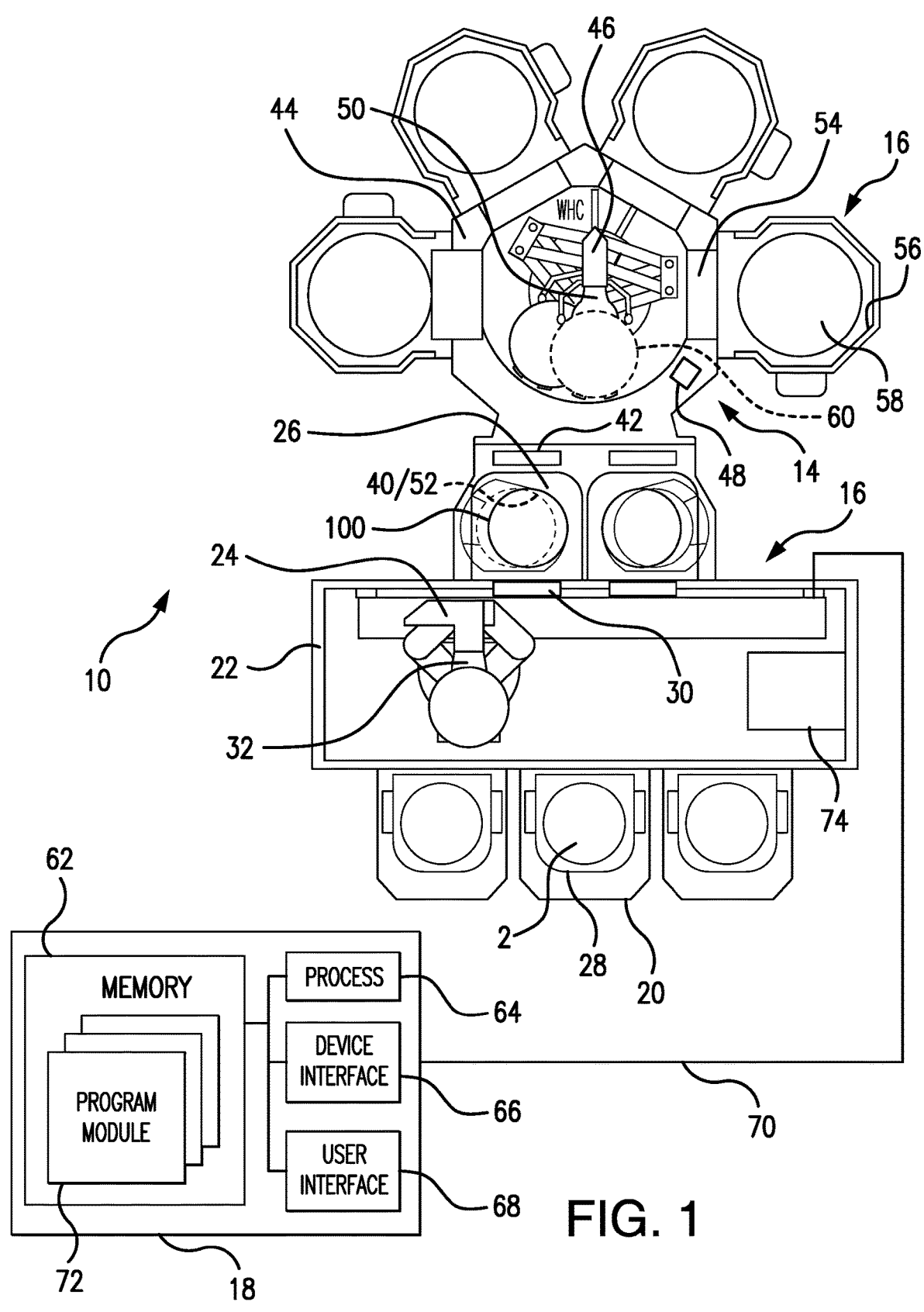
FIG. 1 is a plan view of a semiconductor processing system with a load lock and a jig in accordance with the present disclosure, showing the jig positioned within the load lock.
Figure 2:
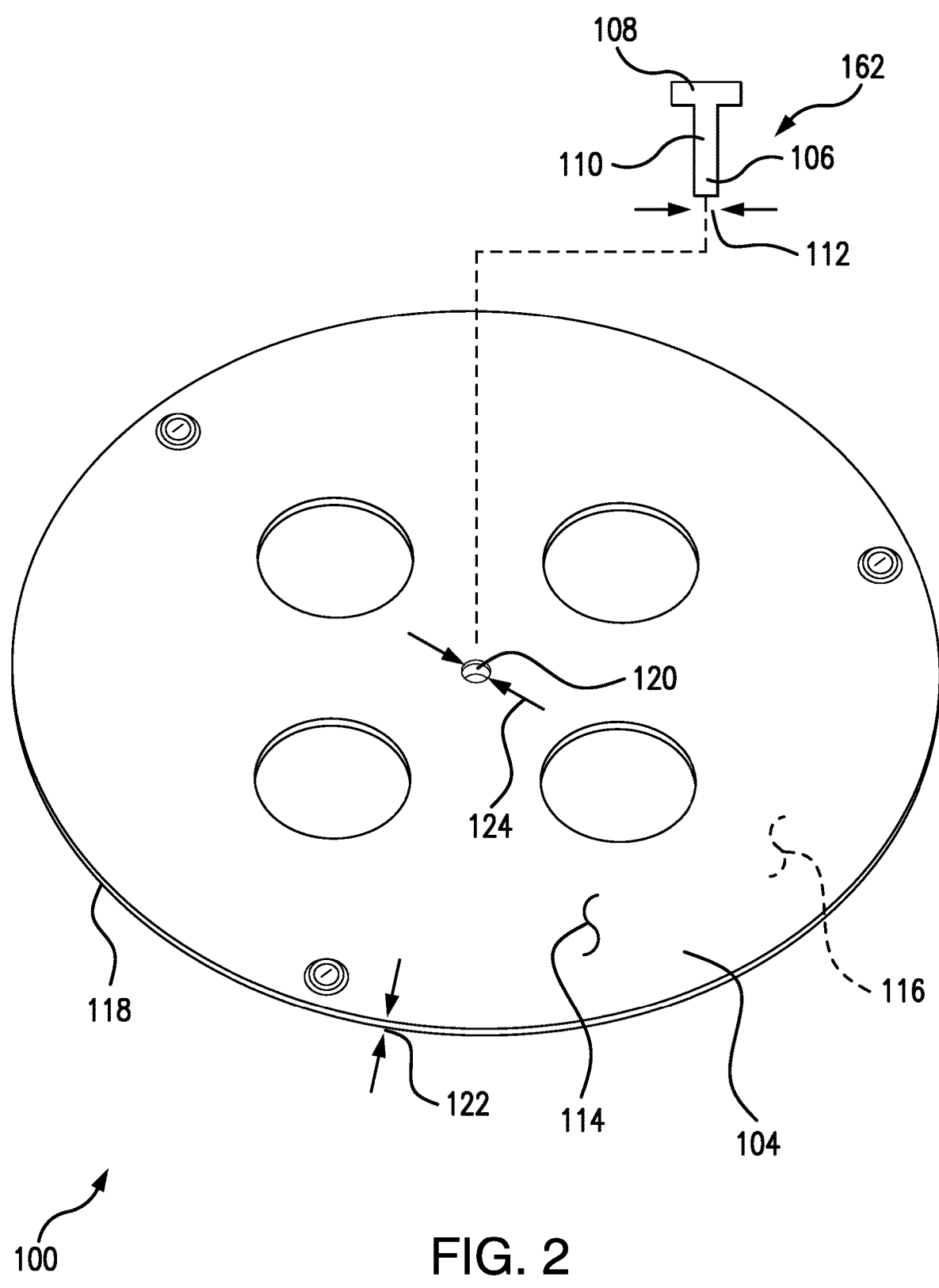
FIGS. 2-5 are perspective, plan, and sectional views of the jig of FIG. 1 according to an example of the jig, showing a verification pin, a jig body, and a friction member of the jig.

FIGS. 12-15 are plan and sectional views of the jig and the semiconductor processing system of FIG. 1, showing a further position being taught by cycling the disc body through the field of view a sensor while captive and frictionally supported on an end effector; and FIGS. 16-19 is a block diagram of a method of teaching substrate handling teaching showing operations of the method according to an illustrative and non-limiting example.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, an example of a jig for teaching substrate handling in a semiconductor processing system in accordance with the present disclosure is shown in FIG. 1 and is designated generally by reference character 100. Other examples of jigs, semiconductor processing systems, and methods of teaching substrate handling in semiconductor processing systems in accordance with the present disclosure, or aspects thereof, are provided in FIGS. 2-19, as will be described. The systems and methods of the present disclosure may be used to teach one or more positions within semiconductor processing systems employed for depositing films onto substrates, such as transfer positions to transfer robots and/or centering positions to substrate centering sensors, though the present disclosure is not limited to teaching any particular position or to any particular type of semiconductor processing system in general.

Referring to FIG. 1, a semiconductor processing system 10 is shown. The semiconductor processing system 10 includes a front-end module 12, back-end module 14, one or more process modules 16, and a controller 18. The front-end module 12 is connected to the back-end module 14. The back-end module 14 is connected to the process module 16 and couples the front-end module 12 therethrough to the process module 16. The process module 16 is configured to process substrates provided to the semiconductor processing system 10, e.g., by removing and/or depositing a film onto a silicon wafer 2, such as using a chemical vapor deposition (CVD) technique such as epitaxy or atomic layer deposition. As shown and described herein the semiconductor processing system 10 is a cluster-type semiconductor processing system having four (4) process modules. This is for illustration purposes only and is non-limiting. As will be appreciated by those of skill in the art in view of the present disclosure, other types of semiconductor processing systems as well semiconductor processing systems having fewer or more than four (4) process modules can also benefit from the present disclosure. Further, to the extent that the semiconductor processing system 10 is shown and described as having a single-substrate process module, it is to be understood and appreciated that semiconductor processing systems having multi-substrate process modules, e.g., dual-substrate, quad-substrate, and event batch-type process modules, may also benefit from the present disclosure.

The front-end module 12 includes a load port 20, a front-end transfer chamber 22, a front-end transfer robot 24, and a load lock 26. The load port 20 is configured to seat thereon a pod 28, e.g., a front-opening unified pod (FOUP), containing a substrate, e.g., the silicon wafer 2, and is connected to the front-end transfer chamber 22. The front-end transfer chamber 22 is connected to the load lock 26 by a front-end gate valve 30, is connected to the load port 20, and houses the front-end transfer robot 24. The front-end transfer robot 24 includes a clamp-type end effector 32 and is movably supported within the front-end transfer chamber 22 to transport substrates between the load port 20 and the load lock 26. The load lock 26 includes a storage rack 34 (shown in FIG. 7) with one or more substrate slot 36 (shown in FIG. 7) and verification pin seat 38 (shown in FIG. 7). It is contemplated that the front-end transfer robot 24 be configured to transport substrates between the load port 20 and the load lock 26 according to a predetermined front-end transfer robot-to-load lock transfer position 40, which may be taught to the front-end transfer robot 24, and which may further require verification (and/or update) during the service life of the semiconductor processing system 10. In certain examples the silicon wafer 2 may be a 300-millimeter wafer.

The back-end module 14 includes a back-end gate valve 42, a back-end transfer chamber 44, a back-end transfer robot 46, and a substrate centering sensor 48. The back-end gate valve 42 connects the back-end transfer chamber 44 to the load lock 26 and is configured to provide selective communication the back-end transfer chamber 44 and the load lock 26. The back-end transfer chamber 44 connects the load lock 26 to the process module 16 and houses the back-end transfer robot 46. The back-end transfer robot 46 is movably supported within the transfer chamber 44, includes a blade-type end effector 50, and is configured to transport substrates between the load lock 26 and the process module 16. It is contemplated that the back-end transfer robot 46 transport substrates, e.g., the silicon wafer 2, between the load lock 26 and the process module 16 according to a predetermined back-end transfer robot-to-load lock transfer position 52, which may be taught to the back-end transfer robot 46 during a qualification setup process, and which may require verification (and/or update) during the service life of the semiconductor processing system 10.

The process module 16 includes a process module gate valve 54, a chamber body 56, and a susceptor or heater 58. The process module gate valve 54 connects the chamber body 56 to the back-end transfer chamber 44 and is configured to provide selective communication between the back-end transfer chamber 44 and the chamber body 56. The chamber body 56 is connected to the back-end transfer chamber 44 and houses the susceptor or heater 58. The susceptor or heater 58 is configured to support a substrate, e.g., the silicon wafer 2, within the chamber body 56 during processing, e.g., the removal and/or deposition of a film onto the surface of the substrate. It is contemplated that back-end transfer robot 46 further be configured to transport substrates between the back-end transfer chamber 44 and the chamber body 56 of the process module 16 according to a predetermined substrate centering position 60, which may be taught to a substrate centering sensor 48 during a qualification setup, and which may further require verification (and/or verification) during the service life of the semiconductor processing system 10.

The controller 18 is operatively connected to the semiconductor processing system 10 and includes a memory 62, a processor 64, a user interface 66, and a device interface 68. The device interface 68 communicatively couples the processor 64 to the semiconductor processing system 10, for example, by a wired or wireless link 70. The user interface 66 is operatively associated with the processor 64 and is configured to provide receive input from a user and/or provide output to the user. The memory 62 includes a non-transitory machine-readable medium having a plurality of program modules 72 recorded thereon containing instructions that, when read by the processor 64, cause the processor 64 to execute certain operations. Among the operations are operations of a method 200 (shown in FIG. 16) of teaching substrate handling in a semiconductor processing system, e.g., the semiconductor processing system 10, as will be described.

During operation the front-end transfer robot 24 first transports a substrate, e.g., the silicon wafer 2, to the substrate slot 36 (shown in FIG. 7) of the storage rack 34 (shown in FIG. 7) located within the load lock 26. The back-end transfer robot 46 in turn transports the substrate from the substrate slot 36 to the process module 16, wherein the substrate is seated on the susceptor or heater 58 and processed, e.g., film removed and/or film deposited onto the surface of the substrate. The substrate is thereafter transported by the back-end transfer robot 46 transports the process substrate to the load lock 26 wherein the substrate may again be positioned within the substrate slot 36 of the storage rack 34. Next, the front-end transfer robot 24 transports the processed substrate from the storage rack 34 to the pod 28, and the pod 28 is thereafter removed from the load port 20 such that the substrate may undergo further processing, as appropriate for the semiconductor device(s) being fabricated using the substrate.

Transport of substrates within the semiconductor processing system 10 is according to one or more positions taught within the semiconductor processing system 10. In this respect the front-end transfer robot 24 transports substrates to and from the load lock 26 into the storage rack 34 according to the predetermined front-end transfer robot-to-load lock transfer position 40. The back-end transfer robot 46 transports substrates to and from the load lock 26 according to the predetermined back-end transfer robot-to-load lock transfer position 52. The back-end transfer robot 46 further positions and retrieves substrates from the process module 16 according to the predetermined substrate centering position 60. To establish (or maintain) the predetermined front-end transfer robot-to-load lock transfer position 40, the predetermined back-end transfer robot-to-load lock transfer position 52, and/or the predetermined substrate centering position 60, the jig 100 is provided.

With reference to FIGS. 2-5, the jig 100 is shown according to an example. The jig 100 generally includes a verification pin 102 with a pin width 112 and a disc body 104. The disc body 104 has a first surface 114, a second surface 116 opposite the first surface 114, and a thickness 122 separating the second surface 116 of the disc body 104 from the first surface 114 of the disc body 104. The first surface 114 and the second surface 116 of the disc body 104 define a verification aperture 120 extending through the thickness 122 of the disc body 104 coupling the first surface 114 to the second surface 116 of the disc body 104. The verification aperture 120 has an aperture width 124 that is substantially equivalent to the pin width 112 of the verification pin 102 to teach a transfer position; e.g., at least one of the front-end robot-to-load lock transfer position 40 (shown in FIG. 1), the back-end robot-to-load lock transfer position 52 (shown in FIG. 1), and the substrate centering position 60 (shown in FIG. 1); within the semiconductor processing system 10 (shown in FIG. 1) by slidably receiving the verification pin 102 in both the verification aperture 120 and the verification pin seat 38 (shown in FIG. 7) defined in the load lock 26 (shown in FIG. 1) of the semiconductor processing system 10 while the disc body 104 is supported by a substrate transfer robot, e.g., one of the front-end transfer robot 24 (shown FIG. 1) and the back-end transfer robot 46 (shown in FIG. 1) within the semiconductor processing system 10.

The verification pin 102 has a first end 106, an opposite second end 108, and a shaft portion 110. The shaft portion 110 connects the second end 108 of the verification pin 102 to the first end 106 of the verification pin 102 and defines the pin width 112. In certain examples, the first end 106 of the verification pin 102 may have a flange extending laterally from the shaft portion 110, allowing the verification pin 102 to be suspended from the verification pin seat 38 (shown in FIG. 7) of the storage rack 34 (shown in FIG. 7). As will appreciated by those of skill in the art in view of the present disclosure, this simplifies use of the jig 100 as the user need not hold the verification pin 102 in place while assessing position of the disc body within the load lock 26 (shown in FIG. 1).

The disc body 104 defines the verification aperture 120 coupling the first surface 114 to the second surface 116 of the disc body 104 and has an outer circumference 118. The verification aperture 120 is centrally located in the disc body 104, e.g., is concentric with a center of the disc body 104, may be circular in shape, and/or may define a keyway. The first surface 114 of the disc body 104 extends about the verification aperture 120, the second surface 116 is opposite the first surface 114 and is spaced from the first surface 114 by the thickness 122 of the disc body 104, and is connected to the first surface 114 by the outer circumference 118 of the disc body 104. The outer circumference 118 of the disc body 104 may have a bevel and/or a notch 140 conforming to a bevel and/or a notch of a 300-millimeter wafer. As will be appreciated by those of skill in the art in view of the present disclosure, the bevel and/or the notch 140 may facilitate handling of the substrate within the semiconductor processing system 10 (shown in FIG. 1), for example, by establishing a rotational orientation of the disc body 104 using a notch alignment device, e.g., a notch aligner 72 (shown in FIG. 1).

Figures 3, 4, 5:
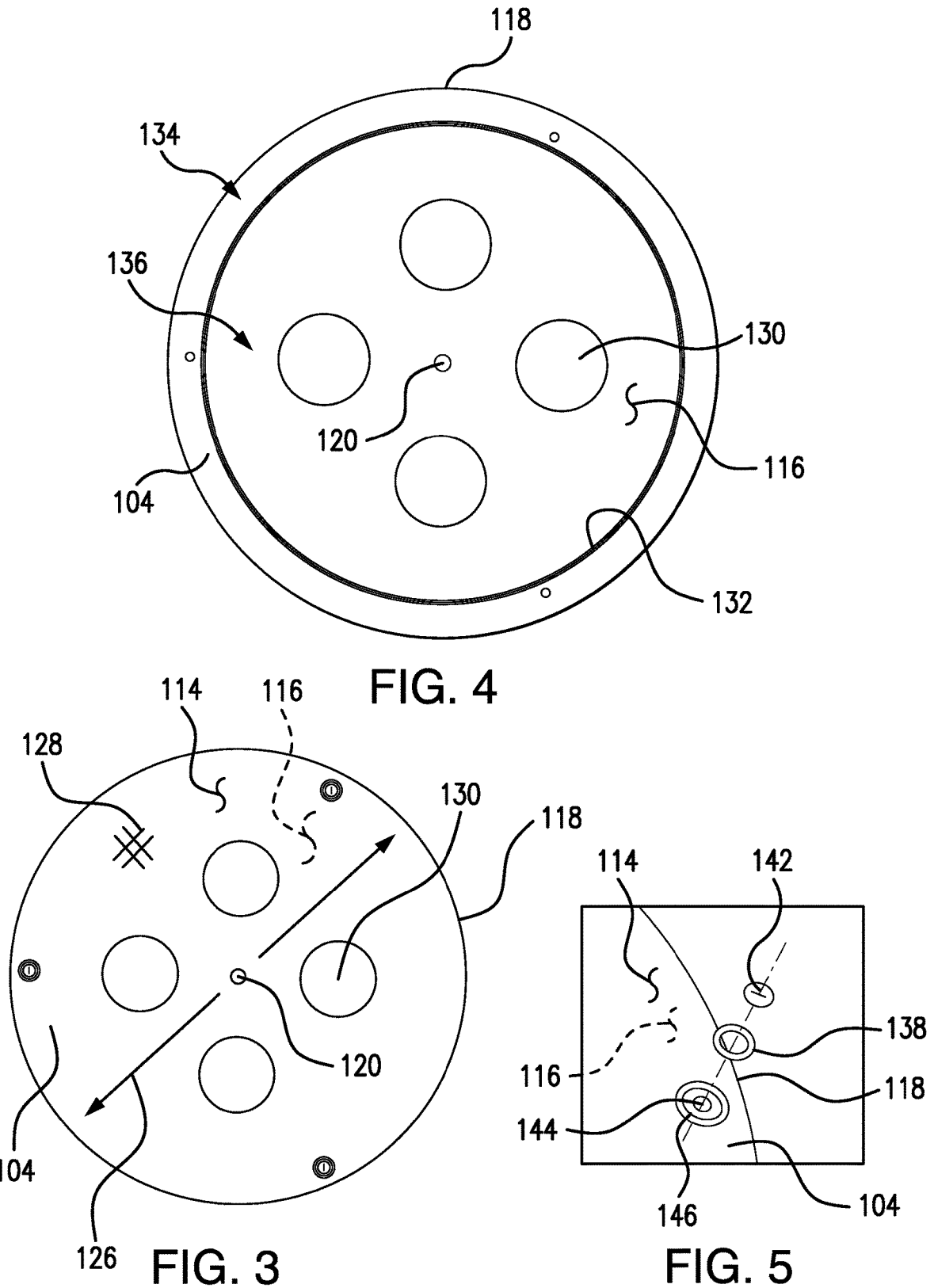

As shown in FIG. 3, the disc body 104 may have a diameter 126 that is substantially equivalent to diameters of substrates processed by the semiconductor processing system 10 (shown in FIG. 1), e.g., a diameter of the silicon wafer 2 (shown in FIG. 1). For example, the diameter 126 may be about 150 millimeters, or about 200 millimeters, or about 300 millimeters, or even about 450 millimeters. As will be appreciated by those of skill in the art in view of the present disclosure, diameters substantially equivalent to those of substrates processed by the semiconductor processing system 10 allow the disc body 104 to be transported within the semiconductor processing system 10 in substantially the same way as substrates processed by the semiconductor processing system 10, e.g., through the front-end module 12 (shown in FIG. 1), using the front-end transfer robot 24 (shown in FIG. 1) and the back-end module 14 (shown in FIG. 1) using the back-end transfer robot 46 (shown in FIG. 1), simplifying the teaching of transfer position(s) and/or centering position in the semiconductor processing system 10.

In certain examples, the disc body 104 may be formed from a composite material 128. Examples of suitable composite materials include fiberglass and carbon fiber materials. As will be appreciated by those of skill in the art in view of the present disclosure, forming the disc body 104 from the composite material 128 reduces risk of damage to the disc body 104, for example, during transport within the semiconductor processing system 10 (shown in FIG. 1) by one or more of the front-end transfer robot 24 (shown in FIG. 1) and the back-end transfer robot 46 (shown in FIG. 1). As will also be appreciated by those of skill in the art in view of the present disclosure, forming the disc body 104 from the composite material 128 also reduces risk of damage to the disc body 104 during manual handling of the disc body 104 outside of the semiconductor processing system 10, such as when a user removes the disc body 104 from the pod 28 (shown in FIG. 1) to invert and return the disc body 104 to the pod 28 (shown in FIG. 1) to perform a sequence of position teach operations.

In certain examples, the disc body 104 may have one or more lightening aperture 130. The one or more lightening aperture 130 extends through the thickness 122 (shown in FIG. 2) of the disc body 104, couples the first surface 114 of the disc body 104 to the second surface 116 of the disc body 104, and is located radially between the verification aperture 120 and the outer circumference 118 of the disc body 104. It is contemplated that the more lightening aperture 130 be sized to match the weight of the disc body 104 to the weight of substrates processed by the semiconductor processing system 10 (shown in FIG. 1). As will be appreciated by those of skill in the art in view of the present disclosure, this allows the disc body 104 to be formed from materials that are more dense than substrates processed by the semiconductor processing system 10, e.g., carbon fiber materials, without impacting accuracy of position teaching in the semiconductor processing system 10, such as by imparting deflection into the end effector transporting the disc body 104 differing from that of substrates processed by the semiconductor processing system 10 due to weight of the disc body 104.

In certain examples, the lightening aperture 130 may be circular in shape. Forming the lightening aperture 130 with a circular shape the impact that the lightening aperture 130 may otherwise have on the mechanical properties of the disc body 104. For example, the circular shape of the lightening aperture 130 may limit stiffness reduction to the disc body otherwise associated with the lightening aperture 130, reducing (or eliminating) deformation of the disc body 104 when supported at the outer circumference 118 (e.g., a periphery) by the an end effector within the semiconductor processing system 10 (shown in FIG. 1). As will be appreciated by those of skill in the art in view of the present disclosure, limiting deformation of the disc body 104 improves the accuracy of the positions taught in the semiconductor processing system 10 (shown in FIG. 1) using the disc body 104, for example, by limiting distortion (e.g., sag) of the disc body 104 when transported by an end effector within the semiconductor processing system 10. In the this respect the lightening aperture 130 may have a shape selected to match stiffness of the disc body 104 to stiffness of substrates, e.g., the silicon wafer 2 (shown in FIG. 1, processed by the semiconductor processing system 10. Although shown and described herein as being circular, it is to be understood and appreciated that the lightening aperture 130 may alternatively have a non-circular shape, e.g., an elliptical or polygonal shape, and remain within the scope of the present disclosure.

In certain examples, the disc body 104 may have a plurality of lightening apertures 130 symmetrically distributed about the verification aperture 120. For example, the disc body 104 may have four (4) lightening apertures 130 circumferentially offset from one another about the verification aperture 120 and arranged on a common radius about the verification aperture 120. As will also be appreciated by those of skill in the art in view of the present disclosure, symmetrically distributing the lightening apertures 130 about the verification aperture 120 may symmetrically distribute weight of the disc body 104. Symmetrically distributing weight of the disc body 104 about the verification aperture 120 allows the disc body to be rotationally aligned within the semiconductor processing system 10 (shown in FIG. 1) using the notch aligner 74 (shown in FIG. 1) by preventing wobble therein, allowing rotational offset of the disc body 104 to be established by the notch aligner 74, and not manually by the user, simplifying the teaching and improving accuracy of certain positions taught in the semiconductor processing system 10. Although shown in FIG. 3 as having four (4) lightening apertures 130, it is to be understood and appreciated that the disc body 104 may have fewer or more lightening apertures than shown in FIG. 3 and remain within the scope of the present disclosure.

As shown in FIG. 4, the disc body 104 may have an annular rim 132 extending circumferentially about the verification aperture 120. In the illustrated example the annular rim 132 is located on the second surface 116 of the disc body 104, extends in a direction opposite the first surface 114 (shown in FIG. 2) from the second surface 116, and conforms in shape (e.g., arc) to an interior surface of an end effector within the semiconductor processing system 10 (shown in FIG. 1), e.g., to an interior surface 76 (shown in FIG. 11) of the blade-type end effector 50 (shown in FIG. 1), such that the disc body 104 is captive within the end effector during transport within the semiconductor processing system 10 by the end effector. As will be appreciated by those of skill in the art in view of the present disclosure, abutting the annular rim 132 against the interior surface 76 of the blade-type end effector 50 can improve accuracy of one or mor positions taught in the semiconductor processing system 10 by limiting (or eliminating) slippage or shifting of the disc body 104 on the blade-type end effector 50 during transport of the disc body 104 in the semiconductor processing system 10.

In certain examples, the annular rim 132 may separate a thin portion 134 of the disc body 104 from a thick portion 136 of the disc body 104. In this respect the thin portion 134 may be located radially between the annular rim 132 and the outer circumference 118 of the disc body 104 such that thin portion 134 extends circumferentially about the verification aperture 120 radially outward of the annular rim 132. In further respect, the thick portion 136 may be located radially inward of the annular rim 132, may extend circumferentially about the verification aperture 120 at a location radially between the thin portion 134 of the disc body 104 and the verification aperture 120, and may further bound the verification aperture 120. As will be appreciated by those of skill in the art in view of the present disclosure, the radially inner thick portion 136 stiffens the disc body 104, also allowing the stiffness of the disc body 104 to be matched to stiffness of substrates processed by the semiconductor processing system 10. For example, the thick portion 136 may offset stiffness reduction otherwise associated with locating the lightening aperture 130 located radially between the annular rim 132 and the verification aperture 120 of the disc body 104.

As shown in FIG. 5, it is contemplated that a friction member 138 may be fixed to a surface of the disc body 104. In this respect it is contemplated that the friction member 138 be fixed to a surface of the disc body 104 at a radial location where, at a predetermined rotational value of the disc body 104 relative to an underlying end effector, the friction member 138 overlays a blade surface 78 (shown in FIG. 9) of the blade-type end effector 50 (shown in FIG. 1). It is further contemplated that the friction member 138 extend in a direction from one of the first surface 114 and the second surface 116 of the disc body 104 that is opposite the other of the first surface 114 and the second surface 116 of the disc body 104. For example, the friction member 138 may be fixed to the first surface 114 of the disc body 104 such that, when the disc body is supported on an end effector within the semiconductor processing system 10 with the first surface 114 opposing the end effector, the friction member 138 (and not the first surface 114) engages the end effector. As will be appreciated by those of skill in the art in view of the present disclosure, supporting the disc body 104 on an end effector through the friction member 138 can also limit sliding and/or shifting of the disc body 104 on an end effector within the semiconductor processing system 10 (shown in FIG. 1). For example, the friction member 138 may be formed from a resilient material such as neoprene or rubber, a coefficient of friction of the material forming the friction member 138 thereby being greater than that of a dummy silicon wafer.

In certain examples, the friction member 138 may be one of a plurality of friction members 138 fixed to the first surface 114 of the disc body 104. In such examples the plurality of friction members 138 may be arranged in a pattern corresponding to a footprint of an end effector supporting the disc body 104, sliding and/or shifting of the disc body 104 on the end effector controlled by the coefficient of friction of the material forming the friction member 138. It is contemplated that the plurality of friction members 138 may be distributed radially between the one or more lightening aperture 130 (shown in FIG. 3) and the outer circumference 118 of the disc body 104. It is also contemplated that the plurality of friction members 138 may be arranged radially outward of the annular rim 132 (shown in FIG. 4). Arranging the plurality of friction members 138 radially outward of the annular rim 132 allows the disc body 104 to be supported on the blade-type end effector 50 (shown in FIG. 1) with the first surface 114 of the disc body 104 opposing the blade-type end effector 50 or the second surface 116 of the disc body 104 opposing the blade-type end effector 50 such that the annular rim 132 of the disc body 104 abuts the interior surface 76 (shown in FIG. 11) of the blade-type end effector 50. As will be appreciated by those of skill in the art in view of the present disclosure, this allows certain positions to be taught in the semiconductor processing system 10 with the disc body 104 fixed relative to the end effector (by the annular rim 132) and other positions taught with the disc body 104 slidably fixed relative to the end effector (by the plurality of friction members 138).

In certain examples, the friction member 138 may include an O-ring. In such examples the friction member 138 may be formed from an elastomeric material that is cleanroom compatible, such as neoprene or rubber. As will also be appreciated by those of skill in the art in view of the present disclosure, forming the friction member 138 may limit (or eliminate) contamination of substrate contact surfaces within the semiconductor processing system 10 (shown in FIG. 1) during teach of positions within the semiconductor processing system 10. As will also be appreciated by those of skill in the art in view of the present disclosure, employment of O-ring can simplify maintaining the disc body 104, for example by simplifying repair of the disc body 104 in the event that one or more of the O-rings becomes damaged.

In certain examples, the friction member 138 may be fixed to the disc body 104 by a keeper 142, for example a slotted example of the keeper 142 having a male-threaded segment. The keeper 142 may be threadedly received within a threaded keeper aperture 144 defined within the first surface 114 of the disc body 104. The keeper 142 may cooperate with an annular ridge 146 extending from the first surface 114 of the disc body 104 and at least partially about the threaded keeper aperture 144. The annular ridge 146 may be configured to deform the friction member 138 when compressed between the annular ridge 146 and the keeper 142 such that a portion of the friction member 138 is disposed on a side of the keeper 142 opposite both the first surface 114 and in a direction opposite the second surface 116 of the disc body 104, the disc body 104 thereby being supported on the blade-type end effector 50 (shown in FIG. 1) by the portion of the friction member 138 forced away from the first surface 114 by the annular ridge 146. As will be appreciated by those of skill in the art in view of the present disclosure, employment of the keeper 142 simplifies assembly and repair of the disc body 104. For example, the friction members 138 may be readily removed to subsequent to teaching positions in a BEOL semiconductor processing system prior to use in FEOL semiconductor processing system.

Figure 6:
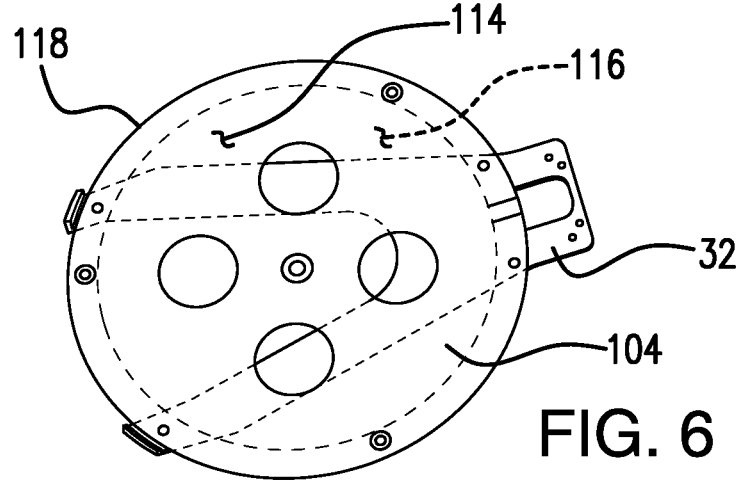
FIGS. 6-8 are plan and sectional views of the jig and the semiconductor processing system of FIG. 1, showing a transfer position being taught by registering the disc body to the load lock and assessing the position by seating a verification pin in the disc body and the load lock.
Figure 7:
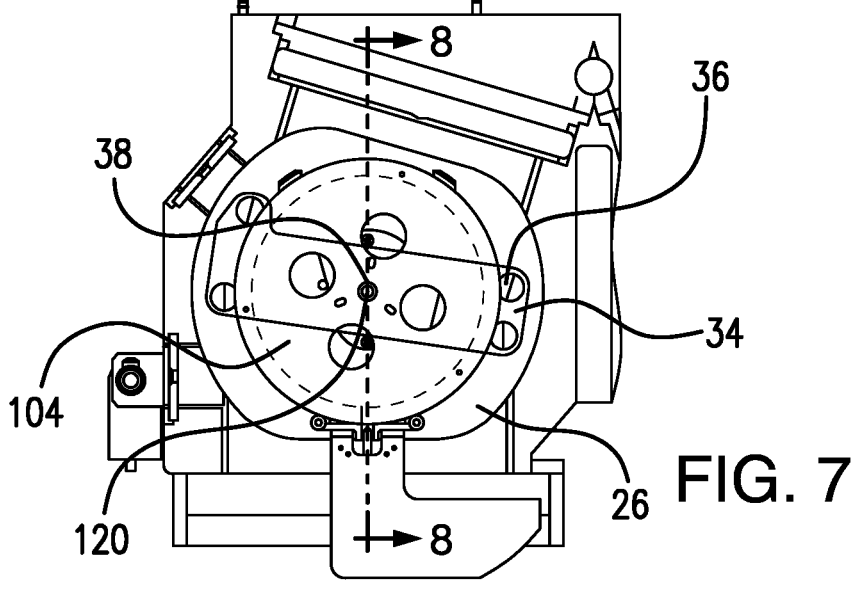
Figure 8:
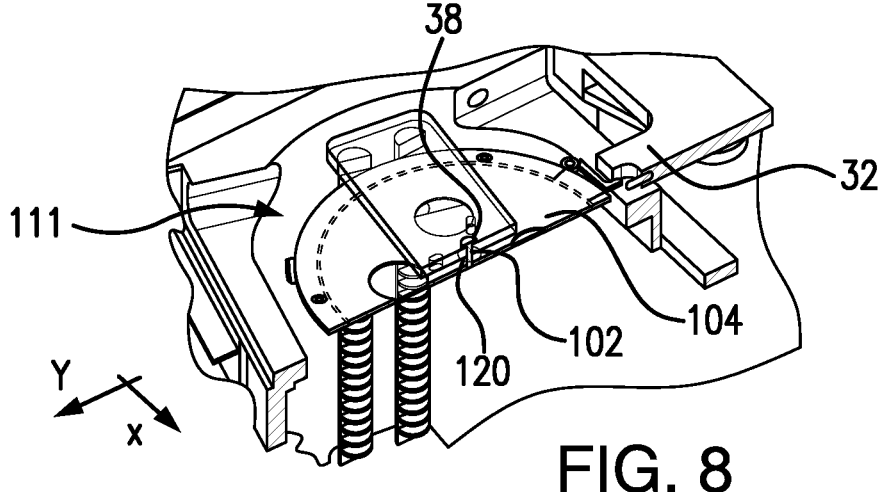

With reference to FIGS. 6-8, the jig 100 (shown in FIG. 1) is shown being employed to teach the front-end transfer robot-to-load lock transfer position 40 (shown in FIG. 1). As shown in FIG. 6, the disc body 104 is first clamped within the clamp-type end effector 32 of the front-end transfer robot 24 (shown in FIG. 1). In this respect it is contemplated that the outer circumference 118 of the disc body 104 be clamped between a fixed post and an opposite movable post of the clamp-type end effector 32, the movable post being driven toward the fixed post to compressively embrace the disc body 104 between the movable post and the fixed post. In certain examples, the disc body 104 may be oriented on the clamp-type end effector 32 such that the second surface 116 of the disc body 104 opposes the clamp-type end effector 32, the first surface 114 of the disc body 104 facing upwards relative to gravity in this respect.

As shown in FIG. 7, the front-end transfer robot 24 (shown in FIG. 1) next transports the disc body 104 to the load lock 26 and inserts the disc body 104 into the substrate slot 36 of the storage rack 34 located within the load lock 26. It is contemplated that the front-end transfer robot 24 position the disc body 104 within the load lock 26 according to a default or previously determined front-end transfer robot-to-load lock transfer position, e.g., the front-end transfer robot-to-load lock transfer position 40 (shown in FIG. 1). It is also contemplated that the front-end transfer robot 24 position the disc body 104 within the load lock 26 such that the verification aperture 120 is registered to the verification pin seat 38 defined in a top plate of the storage rack 34 according to the default or previously determined front-end transfer robot-to-load lock transfer position. As will be appreciated by those of skill in the art in view of the present disclosure, misregistration may exist between the verification aperture 120 and the verification pin seat 38 when the front-end transfer robot 24 is in the default or previously determined front-end transfer robot-to-load lock transfer position. As will also be appreciated by those of skill in the art, the direction and magnitude of the misregistration may be difficult for an observer to discern visually. For this reason, it is contemplated that the verification pin 102 (shown in FIG. 2) be slidably received in the verification pin seat 38 and driven downward toward the first surface 114 of the disc body 104. So positioned, misregistration between the verification aperture 120 and the first end 106 (shown in FIG. 2) of the verification pin 102 is indicated by mechanical interference between the first end 106 of the verification pin 102.

As shown in FIG. 8, position of disc body 104 may thereafter be adjusted to reduce (or eliminate) misregistration between the verification aperture 120 and the verification pin seat 38. In this respect it is contemplated that, in the event that misregistration is indicated by failure of the verification pin 102 to be slidably received with the verification aperture 120, that the user drive front-end transfer robot 24 (shown in FIG. 1) to remove the misregistration; e.g., in the x-direction, the y-direction, and/or tilt; such as by using a teach paddle operably connected to the front-end transfer robot 24 the verification pin 102 may be slidably received within the verification aperture 120 of the disc body 104.

Once the verification pin 102 is slidably received in both the verification pin seat 84 and the verification aperture 120 while the disc body 104 is supported within the clamp-type end effector 32, position of the front-end transfer robot 24 may be written to software as the front-end transfer robot-to-load lock transfer position 40 to update the default or previously determined front-end transfer robot-to-load lock transfer position. For example, position of the front-end transfer robot 24 may be written into one of the plurality of program modules 72 (shown in FIG. 1) recorded on the memory 62 (shown in FIG. 1) once position of the front-end transfer robot 24 allows the verification pin 102 to be slidably received within both the verification pin seat 38 and the verification aperture 120. As will be appreciated by those of skill in the art in view of the present disclosure, establishing (or updating) the front-end transfer robot-to-load lock transfer position 40 (shown in FIG. 1) with the verification pin 102 slidably received in both the verification pin seat 84 and the verification aperture 120 while the disc body 104 is clamped within the clamp-type end effector 32 removes the subjectivity (and associated opportunity for error) otherwise attendant with methods relying upon fiducials like scribe marks or imagery acquired from a camera substrate.

Figure 9:
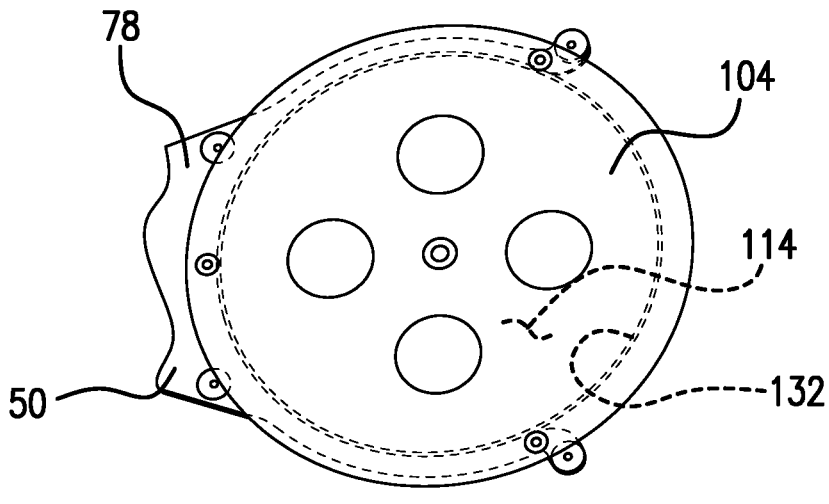
FIGS. 9-11 are plan and sectional views of the jig and the semiconductor processing system of FIG. 1, showing another transfer position being taught by registering the disc body to the load lock and assessing the position by seating a verification pin in the disc body and load lock.
Figure 10:
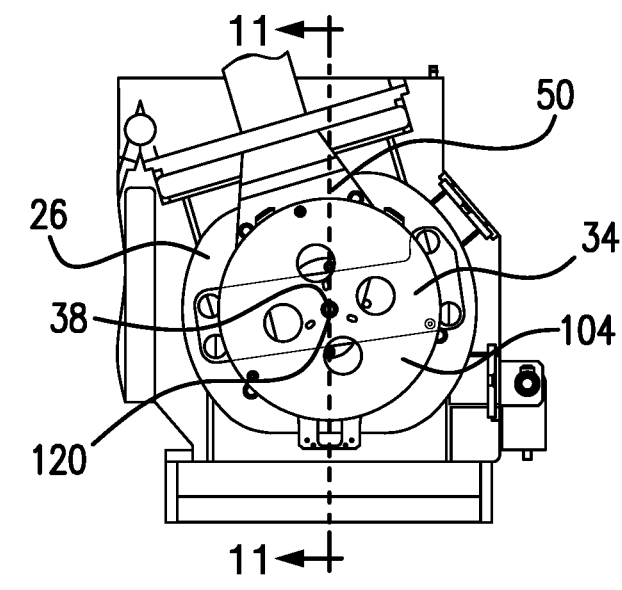
Figure 11:
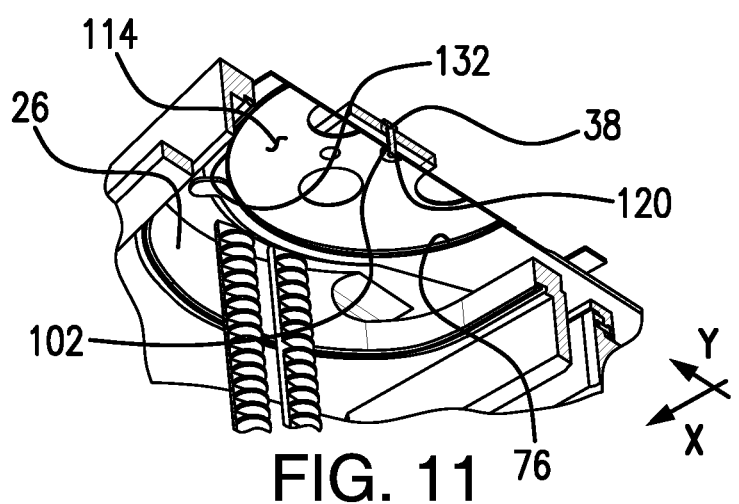

With reference to FIGS. 9-11, the jig 100 (shown in FIG. 1) is shown being employed to teach the back-end transfer robot-to-load lock transfer position 52 (shown in FIG. 1). As shown in FIG. 9, the disc body 104 is first supported on the blade-type end effector 50 of the back-end transfer robot 46 (shown in FIG. 1). It is contemplated that the disc body 104 be supported such that the annular rim 132 defined on the second surface 116 of the disc body 104 abuts the interior surface 76 (shown in FIG. 11) of the blade-type end effector 50 of the back-end transfer robot 46. As will be appreciated by those of skill in the art in view of the present disclosure, abutment of the annular rim 132 against the interior surface 76 renders the disc body 104 captive on the blade-type end effector 50 of the back-end transfer robot 46 during transfer to and from the load lock 26 (shown in FIG. 1). As will also be appreciated by those of skill in the art in view of the present disclosure, captivity prevents sliding of the disc body 104 on the blade-type end effector 50 from limiting accuracy of the back-end transfer robot-to-load lock transfer position, e.g., the back-end transfer robot-to-load lock transfer position 52, taught or verified using the disc body 104.

As shown in FIG. 10, the back-end transfer robot 46 (shown in FIG. 1) next transports the disc body 104 to the load lock 26 and inserts the disc body 104 into the substrate slot 36 of the storage rack 34 located within the load lock 26. As above, it is contemplated that the back-end transfer robot 46 position the disc body 104 within the load lock 26 according to a default or previously determined back-end transfer robot-to-load lock transfer position, e.g., the back-end transfer robot-to-load lock transfer position 52 (shown in FIG. 1). In this respect the back-end transfer robot 46 may retrieve the disc body 104 from the load lock 26 subsequent to placement of the disc body 104 into the load lock 26, transport the disc body 104 to the process module 16 (shown in FIG. 1), and thereafter transport the disc body 104 back to the load lock 26. Once at the load lock 26, the back-end transfer robot 46 positions the disc body 104 within the storage rack 34 according to a default or previously taught back-end transfer robot-to-load lock transfer position, the back-end transfer robot 46, registering the verification aperture 120 with the verification pin seat 38 defined in a top plate of the storage rack 34 according to the default or previously determined back-end transfer robot-to-load lock transfer position.

As above, misregistration may also exist between the verification aperture 120 and the verification pin seat 38 when the back-end transfer robot 46 is in the default or previously taught back-end transfer robot-to-load lock transfer position. Since direction and magnitude of the misregistration may be difficult for an observer to visually discern, the verification pin 102 (shown in FIG. 2) is again therefore slidably received in the verification pin seat 38 and driven toward the first surface 114 of the disc body 104. As above, misregistration between the disc body 104 and the load lock 26 associated with the default or previously determined back-end transfer robot-to-load lock transfer position is being indicated in instances where position of the disc body 104 prevents insertion of the verification pin 102 into the verification aperture 120.

As shown in FIG. 11, position of disc body 104 is adjusted to reduce (or eliminate) misregistration between the verification aperture 120 and the verification pin seat 38. In this respect the user may again drive the back-end transfer robot 46 (shown in FIG. 1) in the x-direction, the y-direction, and/or tilt of the disc body 104 until the registration is such that the verification pin 102 may be slidably received within both the verification pin seat 38 and the verification aperture 120 while the disc body 104 is supported by the blade-type end effector 50. Once the verification pin 102 is slidably received in both the verification pin seat 38 and the verification aperture 120 while the disc body 104 is captive on the blade-type end effector 50, position of the back-end transfer robot 46 may be written to software as the back-end transfer robot-to-load lock transfer position 52 (shown in FIG. 1). As above, in certain examples, position of the back-end transfer robot 46 may be written into one of the plurality of program modules 72 (shown in FIG. 1) recorded on the memory 62 (shown in FIG. 1). As will be appreciated by those of skill in the art in view of the present disclosure, establishing (or updating) the back-end transfer robot-to-load lock transfer position 52 with the verification pin 102 slidably received in both the verification pin seat 84 and the verification aperture 120 while the disc body 104 is captive on the blade-type end effector 50 also removes the subjectivity (and associated opportunity for error) otherwise attendant with teaching methods relying upon fiducials or imagery, such as methods employing by substrate to scribe mark matchup or a camera substrate.

Figures 12, 13, 14, 15:
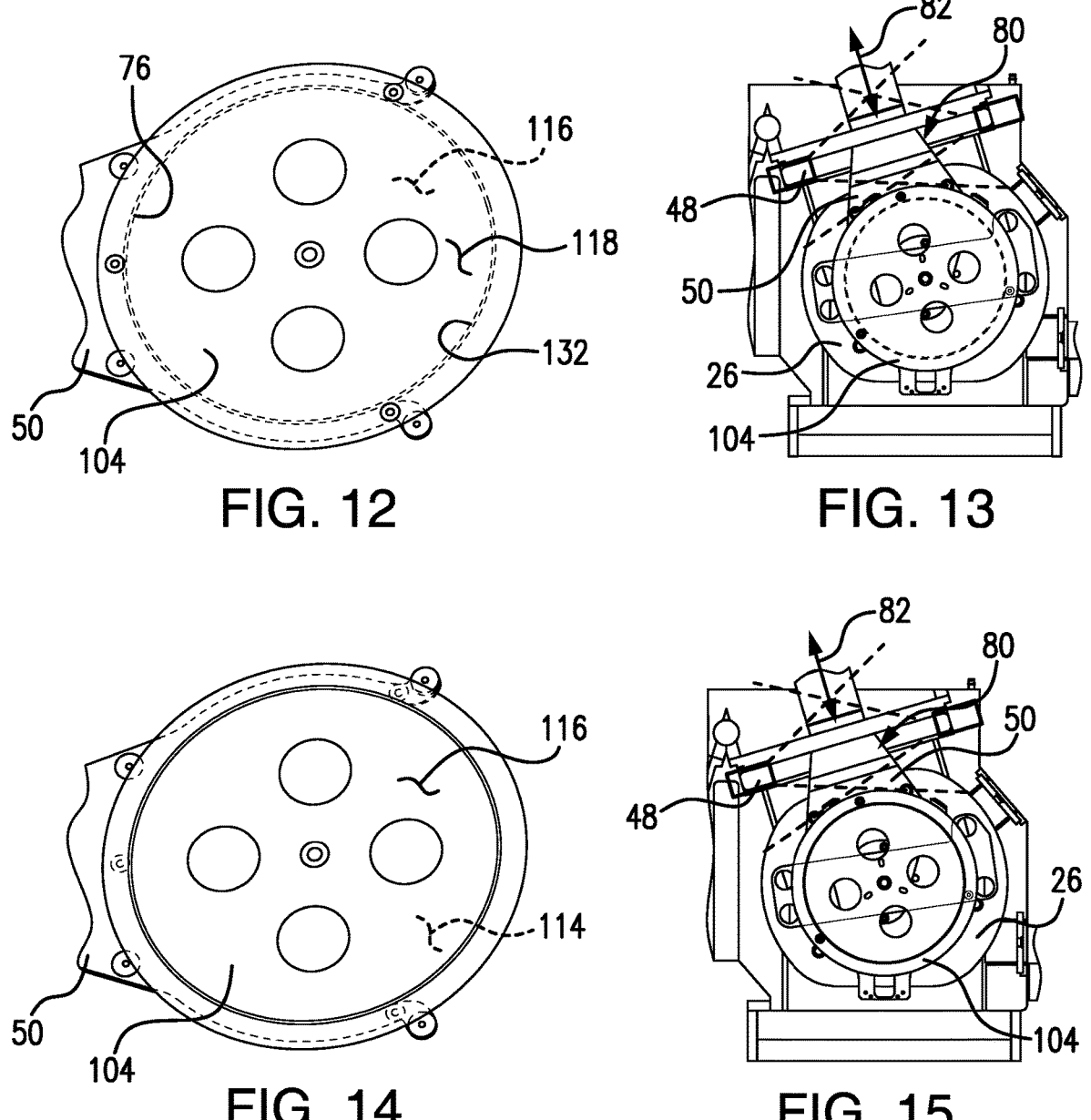

With reference to FIGS. 12-15, the disc body 104 of the jig 100 (shown in FIG. 1) is shown during teach of the substrate centering position 60 (shown in FIG. 1) according to two alternative methods. As shown in FIGS. 12 and 13, the disc body 104 may be supported on the blade-type end effector 50 such that the disc body 104 is captive between blades (or opposing tines) of the blade-type end effector 50. Capture of the disc body 104 within the blade-type end effector 50 is accomplished by transferring the disc body 104 to the blade-type end effector 50 with the second surface 116 of the disc body 104 oriented downward. Orienting the second surface 116 downwards allows the annular rim 132 to abut the interior surface 76 between the opposing blades of the blade-type end effector 50, the disc body 104 thereby captive within the blade-type end effector 50 and preventing (or eliminating) shifting or sliding of the disc body 104 on the blade-type end effector 50. This allows the back-end transfer robot 46 (shown in FIG. 1) to cycle 82 the disc body 104 between the load lock 26 (shown in FIG. 1) and the process module 16 (shown in FIG. 1) of the semiconductor processing system 10 (shown in FIG. 1) without the slippage and/or shifting possible during cycling of dummy silicon wafers.

As the disc body 104 is cycled between the load lock 26 and the process module 16 (shown in FIG. 1), the disc body 104 passes through a field of view 80 of the substrate centering sensor 48. As the disc body 104 passes through the field of view 80 of the substrate centering sensor 48, the substrate centering sensor 48 acquires a substrate centering position according to position of the disc body 104 on the blade-type end effector 50. It is contemplated that the substrate centering position acquired by the substrate centering sensor 48 be written into software as the substrate centering position 60 (shown in FIG. 1), for example, by being written into one of the plurality of program modules 72 (shown in FIG. 1) recorded on the memory 62 (shown in FIG. 1). Advantageously, as the disc body 104 is captive within the blade-type end effector 50, abutment of the annular rim 132 against the interior surface 76 of the blade-type end effector 50 limits (or eliminates) slippage and shifting of the disc body 104 on the blade-type end effector 50, improving accuracy of the substrate centering position 60.

As shown in FIGS. 14 and 15, the disc body 104 may alternatively be frictionally supported on the blade-type end effector 50 to teach (or update) the substrate centering position 60 (shown in FIG. 1). Teaching the substrate centering position 60 with the disc body 104 frictionally supported on the blade-type end effector 50 entails orienting the disc body 104 such that the first surface 114 of the disc body 104 faces downward and opposes tines of the blade-type end effector 50. Orienting the disc body 104 such that the first surface 114 faces downward allows the disc body 104 to be supported on the tines of the blade-type end effector 50 by the friction members 138, limiting (or eliminating) slippage and shifting of the disc body 104 on the blade-type end effector 50 according to the coefficient of friction of the friction member 138 and the weight of the disc body 104. In certain examples, the disc body 104 may be rotationally aligned according to a predetermined rotational offset using the notch aligner 74 (shown in FIG. 1) to bring the friction members 138 into registration with the blade-type end effector 50, simplifying teaching of the substrate centering position 60 in the illustrated orientation of the disc body 104. As above, this allows the back-end transfer robot 46 (shown in FIG. 1) to cycle 82 the disc body 104 between the load lock 26 (shown in FIG. 1) and the process module 16 (shown in FIG. 1) of the semiconductor processing system 10 (shown in FIG. 1) without the slippage and/or shifting possible during cycling of dummy silicon wafers.

As the disc body 104 is cycled between the load lock 26 and the process module 16 (shown in FIG. 1), the disc body 104 passes through a field of view 80 of the substrate centering sensor 48. As the disc body 104 passes through the field of view 80 of the substrate centering sensor 48, the substrate centering sensor 48 acquires a substrate centering position according to position of the disc body 104 on the blade-type end effector 50. It is contemplated that the substrate centering position acquired by the substrate centering sensor 48 be written into software as the substrate centering position 60 (shown in FIG. 1), for example, by being written into one of the plurality of program modules 72 (shown in FIG. 1) recorded on the memory 62 (shown in FIG. 1). Advantageously, as the disc body 104 is captive within the blade-type end effector 50, abutment of the annular rim 132 against the interior surface 76 of the blade-type end effector 50 limits (or eliminates) slippage and shifting of the disc body 104 on the blade-type end effector 50, improving accuracy of the substrate centering position 60.

With reference to FIGS. 16-19, the method 200 of teaching substrate handling in a semiconductor processing system, e.g., the semiconductor processing system 10 (shown in FIG. 1), is shown. As shown in FIG. 16, the method 200 includes teaching a front-end transfer robot-to-load lock transfer position to a front-end transfer robot of the semiconductor processing system, e.g., teaching the front-end transfer robot-to-load lock transfer position 40 (shown in FIG. 1) to the front-end transfer robot 24 (shown in FIG. 1), using a disc body and verification pin of a jig, e.g., the disc body 104 (shown in FIG. 2) and the verification pin 102 (shown in FIG. 2) of the jig 100 (shown in FIG. 1), as shown with box 210. The method 200 also includes teaching a back-end transfer robot-to-load lock transfer position to a back-end transfer robot of the semiconductor processing system, e.g., the back-end transfer robot-to-load lock transfer position 52 (shown in FIG. 1) to the back-end transfer robot 46 (shown in FIG. 1), using the disc body and the verification pin of the jig, as shown with box 220. The method 200 further includes teaching a substrate centering position to a substrate centering sensor of the semiconductor processing system, e.g., the substrate centering position 60 (shown in FIG. 1) to the substrate centering sensor 48 (shown in FIG. 1), and the disc body of the jig, as shown with box 230. As will be appreciated by those of skill in the art in view of the present disclosure, teaching each of the three positions with a singular jig can simplify the teaching process, for example, by eliminating the need to employ and maintain more than one jig or fixture for teaching the positions. Although a particular group and order of operations is shown in FIG. 15 and described herein, it is to be understood and appreciated that the method may include fewer operations, additional operations, or a different sequence of operations, and remain within the scope of the present disclosure.

As shown in FIG. 17, teaching 210 the front-end transfer robot-to-load lock transfer position includes supporting the disc body of the jig on an end effector of the front-end robot, e.g., the clamp-type end effector 32 (shown in FIG. 1), as shown with box 212. Once the disc body is supported on the end effector, the front-end transfer robot transports the disc body to a storage rack within a load lock of the semiconductor processing system, e.g., the storage rack 34 (shown in FIG. 1) within the load lock 26 (shown in FIG. 1), as shown with box 214. Placement of the disc body into the substrate slot registers a verification aperture of the disc body within a verification pin seat of the storage rack, e.g., the verification aperture 120 (shown in FIG. 1) with the verification pin seat 38 (shown in FIG. 1), as shown with box 216. It is contemplated that misregistration between the verification aperture and the verification pin seat be determined by slidably seating a verification pin, e.g., the verification pin 102 (shown in FIG. 2), within the verification pin seat of the storage rack and thereafter observing alignment of the verification pin with the verification aperture, as shown with box 218.

When misregistration is such that the verification pin can be slidably received within the verification aperture of the disc body, position of the front-end transfer robot is written to software as the front-end transfer robot-to-load lock transfer position, as shown with box 213, arrow 211, and box 240. When the verification pin cannot be slidably received within the verification aperture position of the front-end transfer robot is adjusted, alignment of the verification pin with the verification aperture again observed, and misregistration determined again after the adjustment, as shown with arrow 215, arrow 217, and box 219. For example, the position of the front-end transfer robot may be written to one of the plurality of program modules 72 (shown in FIG. 1) recorded on the memory 62 (shown in FIG. 1) of the controller 18 (shown in FIG. 1) as the front-end transfer robot-to-load lock transfer position 40 (shown in FIG. 1).

As shown in FIG. 18, teaching 220 the back-end transfer robot-to-load lock transfer position 52 (shown in FIG. 1) may be accomplished by supporting the disc body on an end effector of a back-end end robot, e.g., on the blade-type end effector 50 (shown in FIG. 1) of the back-end transfer robot, as shown with box 222. The back-end transfer robot may then transport the disc body to the load lock and place the disc body in the storage rack located within the load lock, e.g., according to a default or a previously established back-end transfer robot-to-load lock transfer position, as shown with box 224. As above, placement of the disc body into the substrate slot registers the verification aperture of the disc body with the verification pin seat of the storage rack, as shown with box 226. Misregistration between the verification aperture and the verification pin seat associated with the placement may then be determined by slidably seating the verification pin within the verification pin seat of the storage rack and observing alignment of the verification pin with the verification aperture, as shown with box 228.

When misregistration is such that the verification pin can be slidably received within the verification aperture of the disc body, position of the back-end transfer robot is written to software as the back-end transfer robot-to-load lock transfer position, as shown with arrow 221, box 223, and box 250. When misregistration is such that the verification pin cannot be slidably received within the verification aperture position of the back-end transfer robot is adjusted (e.g., iteratively), alignment of the verification pin with the verification aperture may again be observed and position of the back-end transfer robot be written to software as the front-end transfer robot-to-load lock transfer position when the verification pin may be slidably received within the verification aperture, as shown with arrow 225, arrow 227, and box 229. As above, the position of the back-end transfer robot may also be written to one of the plurality of program modules 72 (shown in FIG. 1) recorded on the memory 62 (shown in FIG. 1) of the controller 18 (shown in FIG. 1) as the back-end transfer robot-to-load lock transfer position 52 (shown in FIG. 1).

As shown in FIG. 19, teaching 230 of the substrate centering position 60 (shown in FIG. 1) may be accomplished by supporting the disc body the end effector of the back-end transfer robot according to a default or existing substrate centering value, as shown with box 232. The disc body is then transported between the load lock and the process module of the semiconductor processing system by the back-end transfer robot, as shown with box 234. As the disc body is transported between the load lock and the process module of the semiconductor processing system by the back-end transfer robot, the disc body moves through a field of view of the substrate centering sensor, and the substrate centering sensor acquires centering of the disc body, as shown with box 236. A substrate centering position is determined using the acquired centering of the disc body, as shown with box 238. The determined substrate centering position is then written to software as a substrate centering position of the substrate centering sensor, e.g., the substrate centering position 60 (shown in FIG. 1), as shown with box 231.

In certain examples, the disc body may be captive within the end effector of the back-end transfer robot, as shown with box 233. For example, the disc body may be supported such that an annular rim located on a surface of the disc body abuts an interior surface of the end effector, e.g., the annular rim 132 (shown in FIG. 3) located of the first surface 114 (shown in FIG. 3) of the disc body abuts the interior surface 76 (shown in FIG. A). In accordance with certain examples, the disc body may be frictionally engaged to the end effector of the back-end transfer robot, as shown with box 235. For example, the disc body may be supported such that one or more friction member fixed to a surface spaces the disc body from the end effector of the back-end transfer robot. In this respect the disc body may be unloaded from the semiconductor processing system, inverted, and returned to the end effector of the back-end transfer robot via a substrate aligner, as shown with box 237. It is also contemplated hat, in accordance with certain examples, that the disc body may be cyclically be transported through the field of the view of the substrate centering sensor, and the substrate centering position be determined using a plurality of substrate centering position measurements acquired during the cycling, as shown with arrow 239.

Substrate transfer robots, e.g., wafer transfer robots, generally require teaching to establish wafer movement paths in semiconductor processing systems. Teaching may be accomplished, for example, using a camera wafer or by observing matchup between a silicon wafer and scribing on the transfer robot end effector, and wafer centering sensors can be taught by cycling a silicon wafer through the field of view of the wafer centering sensor. While generally acceptable for its intended purpose, camera wafers are expensive and require periodic calibration, eyeballing silicon wafer to scribing matchup can be inconsistent and depends upon the experience of the individual observing the matchup, and wafer centering sensor calibration established by cycling silicon wafers through the field of view of the sensor may be inaccurate in the event that the wafer shifts or slides on the transfer robot end effector.

In examples described herein, a common jig is provided that can pin teach both the front-end transfer robot and the back-end transfer robot as well as teach wafer centering position to the automatic wafer centering sensor. The jig includes a disc body and pin, which eliminates the need to teach the front-end transfer robot using a camera wafer and the need to teach the back-end robot using by observing matchup between a silicon wafer and scribing on the back-end transfer robot end effector. In certain examples, the jig may further include a friction member and/or an annular rim to teach centering to a wafer centering sensor.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

The invention claimed is:

1. A jig for teaching substrate handling in a semiconductor processing system, comprising:

a verification pin with a pin width;

a disc body having a first surface, a second surface opposite the first surface, and a thickness separating the second surface from the first surface of the disc body, wherein the first surface and the second surface define a verification aperture coupling the first surface to the second surface of the disc body, wherein the verification aperture has an aperture width substantially equivalent to the pin width of the verification pin to teach a transfer position within the semiconductor processing system by slidably receiving the verification pin in both the verification aperture and a verification pin seat defined in a load lock of the semiconductor processing system while supported by a substrate transfer robot within the semiconductor processing system, and wherein the disc body has an annular rim extending circumferentially about the verification aperture, wherein the annular rim is located radially between the verification aperture and an outer circumference of the disc body, and at least one friction member fixed to the first surface of the disc body, wherein the at least one friction member is positioned radially between the annular rim and the outer circumference of the disc body, wherein the annular rim is defined on one of the first surface and the second surface of the disc body, wherein the at least one friction member is fixed to the other of the first surface and the second surface of the disc body.

2. The jig of claim 1, wherein the disc body is formed from a carbon fiber material, and wherein the disc body has a diameter substantially equivalent to a 300-millimeter silicon wafer.

3. The jig of claim 1, wherein the disc body has one or more lightening aperture extending through the thickness of the disc body between the first surface and second surface of the disc body, wherein the lightening aperture is located radially between the verification aperture and the outer circumference of the disc body.

4. The jig of claim 3, wherein the lightening aperture is one of a plurality of lightening apertures symmetrically distributed about the verification aperture.

5. The jig of claim 3, wherein the lightening aperture is one of four (4) lightening apertures having a circular shape, wherein the four (4) lightening apertures are distributed circumferentially about the verification aperture on a common lightening aperture radius.

6. The jig of claim 1, further comprising a friction member that comprises an electrostatic material and an O-ring and that is fixed to the first surface of the disc body, wherein the friction member is located radially between the verification aperture of the disc body and the outer circumference of the disc body.

7. The jig of claim 6, wherein the friction member has a coefficient of friction that is greater than a coefficient of friction of a surface of a dummy silicon wafer.

8. The jig of claim 6, wherein the friction member comprises an O-ring formed from an elastomeric material, and wherein the outer circumference of the disc body has a notch.

9. The jig of claim 6, wherein the friction member is one of a plurality of friction members fixed to the first surface of the disc body.

10. The jig of claim 9, wherein the friction member is one of three (3) friction members fixed to the first surface of the disc body, wherein the plurality of friction members are distributed circumferentially about the verification aperture on a common friction member radius.

11. The jig of claim 10, wherein the plurality of friction members conform in spacing to tines of an end effector, the friction members spacing the disc body from the tines of the end effector.

12. The jig of claim 1, wherein the annular rim extends between a radially outer thin portion of the disc body and a radially-inner thick portion of the disc body, wherein the radially-inner thick portion extends radially between the annular rim and the verification aperture extending through the thickness of the disc body.

13. The jig of claim 1, wherein the disc body has at least one lightening aperture extending through the thickness of the disc body, wherein the at least one lightening aperture is located radially between the verification aperture and the annular rim of the disc body.

14. The jig of claim 1, wherein the annular rim conforms in radius to an arcuate segment of a face of an end effector of the semiconductor processing system.

15. A semiconductor processing system, comprising:
a load lock with a verification pin seat;
a substrate centering sensor fixed relative to the load lock and having a field of view;
a front-end substrate transfer robot with a clamp end effector supported for movement relative for movement relative the load lock;
a back-end substrate transfer robot with a blade end effector supported for movement relative to the load lock; and
a jig as recited in claim 1, wherein the disc body (a) clamped within the clamp end effector and fixed to the load lock by the verification pin, (b) frictionally supported on the blade end effector and fixed to the load lock by the verification pin, (c) captively supported on the blade end effector and fixed to the load lock by the verification pin, or (d) frictionally supported or captively supported on the blade end effector and within the field of view of the substrate centering sensor.

* * * * *